United States Patent [19]
Koyama et al.

[11] Patent Number: 5,990,008
[45] Date of Patent: *Nov. 23, 1999

[54] SEMICONDUCTOR DEVICE WITH PURE COPPER WIRINGS AND METHOD OF MANUFACTURING A SEMICONDUCTOR DEVICE WITH PURE COPPER WIRINGS

[75] Inventors: Mitsutoshi Koyama, Yokkaichi; Takeshi Kubota, Ichikawa, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/934,751

[22] Filed: Sep. 22, 1997

[30] Foreign Application Priority Data

Sep. 25, 1996 [JP] Japan ................................ 8-253185

[51] Int. Cl.$^6$ .................................................. H01L 21/44
[52] U.S. Cl. .......................... 438/687; 438/660; 438/629; 438/643; 438/653; 438/668; 438/672; 438/675; 438/680
[58] Field of Search .................................... 438/687, 626, 438/627, 629, 631, 632, 633, 637, 643–645, 648, 653, 654, 656, 660, 668, 672, 675, 680, 685; 420/469, 500; 148/432

[56] References Cited

U.S. PATENT DOCUMENTS

| | | | |
|---|---|---|---|
| 4,591,484 | 5/1986 | Miyafuji et al. | 420/481 |
| 4,842,891 | 6/1989 | Miyazaki et al. | 427/35 |
| 5,085,731 | 2/1992 | Norman et al. | 156/646 |
| 5,143,867 | 9/1992 | D'Heurle | 437/188 |
| 5,370,840 | 12/1994 | Caron et al. | 420/492 |
| 5,391,517 | 2/1995 | Gelatos et al. | 437/190 |
| 5,654,232 | 8/1997 | Gardner | 438/661 |

*Primary Examiner*—John F. Niebling
*Assistant Examiner*—David A Zarneke
*Attorney, Agent, or Firm*—Finnegan, Henderson, Farabow, Garrett & Dunner, L.L.P.

[57] ABSTRACT

In a method for forming a high aspect ratio structure using copper in an ultra high-speed device, the degree of copper burying is heightened. A high aspect ratio structure, such as a fine connecting hole, is formed in a layer insulating film on a silicon substrate. Then, after a CVD-TiN film is formed to have a thickness of 10 nm on the insulating film, a copper film having a thickness of 1 $\mu$m is formed. In this case, the highly pure copper film is formed by controlling film-forming conditions so as to set oxygen and sulfur concentrations in the film equal to a fixed level or lower. Thus, during its burying in the connecting hole, the surface diffusibility and fluidity of the copper film heated by means of laser irradiation are facilitated.

45 Claims, 5 Drawing Sheets

SEMICONDUCTOR DEVICE WITH PURE COPPER WIRINGS AND METHOD OF MANUFACTURING A SEMICONDUCTOR DEVICE WITH PURE COPPER WIRINGS

BACKGROUND OF THE INVENTION

The present invention relates to semiconductor devices and methods of manufacturing the semiconductor devices. More particularly, the invention relates to semiconductor devices and methods of manufacturing semiconductor devices having a formation of pure copper wiring in an ultra high-speed semiconductor device. The semiconductor device may also be used in certain discrete devices such as Intelligent Power Devices (IPD), which may be used in automobiles or other products.

Forming finer wiring for semiconductors results in a corresponding decrease in operating speed as a result of an increase in wiring resistance. Some attempts have been made to set wiring in an ultra high-speed device by means of Cu, which has an electric resistance smaller than that of Al alloys which are typically used.

Conventionally, reactive ion etching (RIE) using a resist as a masking material has been employed for forming wiring. According to this method, Al is etched in the form of a halide by exciting a gas containing fluorine, chlorine, bromine, and the like, in plasma.

Since Cu has a lower vapor pressure as a halide than Al, however, a temperature of 200° C. to 300° C. or higher is necessary to obtain a practical etching rate if the RIE method is used. Consequently, there have been various difficulties to overcome, such as manufacturing a chamber resistant to high temperature, increasing compatibility between etching and anisotropy, and selection of a masking material. In an attempt to overcome at least some of these difficulties, studies have been conducted on buried wiring using Cu without using the RIE method.

Figure 1A:
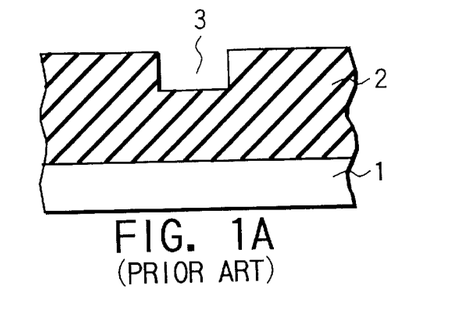
FIGS. 1A to 1D are section views showing a typical method for forming Cu buried wiring.
Figure 1B:
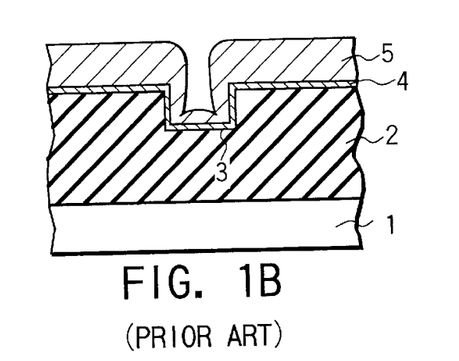
Figure 1C:
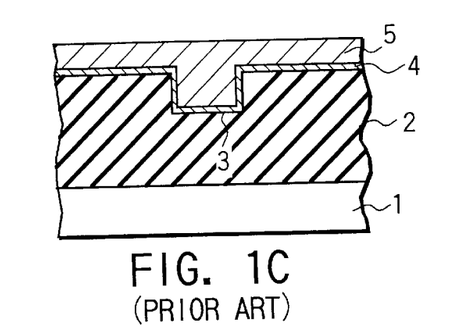
Figure 1D:
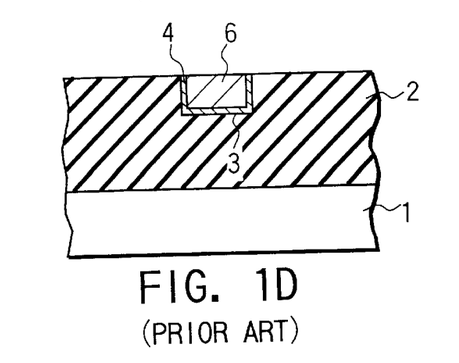

FIGS. 1A to 1D illustrate a typical method of forming Cu buried wiring. First, a groove 3 is formed in a layer insulating film 2 on a silicon substrate 1 according to a desired wiring pattern (FIG. 1A). A Cu film 5 is then formed on the insulating film 2, thus interposing an adhesive layer 4 for preventing the diffusion of Cu into the silicon, and the inside of the groove 3 is filled (FIGS. 1B and 1C). Thereafter, by eliminating the superfluous Cu film 5 remaining in other than groove 3 by means of a chemical mechanical polishing (CMP) method, the Cu buried wiring 6 is formed (FIG. 1D). Such a method of forming buried wiring is not only a CMP technology, it is also a technology for filling up the groove 3 with Cu, which is highly difficult.

Technology for burying Cu can be roughly divided into two categories: a burying method carried out by depositing Cu similarly in the side face and the bottom surface of the groove by means of a CVD method, and a method of burying Cu in the groove after applying a heat treatment to Cu deposited by means of a sputtering method.

Much still remains unknown, however, about the Cu burying method to which the CVD method is applied. For example, little is known about mass production of the CVD method. It is possible that the Cu burying method, which may utilize Cu sputtering, may be the first mass production technology.

For heat treatments, there are two ways the Cu burying method may use the sputtering method. One is to heat the silicon substrate during Cu sputtering, and the other is to heat Cu deposited by means of sputtering.

The latter way of heating Cu after sputtering is further divided into a heating furnace method, by which the entire silicon substrate is heated within a fixed period by using a heating furnace, and a laser irradiation method, by which Cu is heated to a temperature higher than in the case of the heating furnace method by irradiating the same with a short wavelength laser only for an extremely short period of 1 millisecond or less.

The foregoing methods, however, have not yet provided the degree of Cu burying necessary for its application to a next-generation ultra high-speed device having a fine contact hole and the like.

Figure 2A:
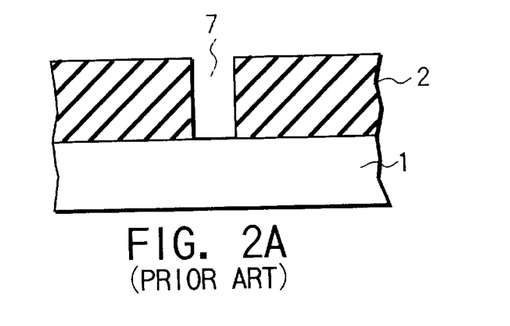
FIGS. 2A to 2D are section views showing a conventional method for forming a fine contact hole, which uses Cu.

FIGS. 2A to 2D illustrate a method of forming a fine contact hole using Cu. First, a connecting hole 7 with a depth reaching the surface of the silicon substrate 1 is formed in the insulating film 2 on the silicon substrate (FIG. 2A). The opening dimension of connecting hole 7 is set to, for instance, 0.35 mm in diameter and 1.0 mm in depth.

Figure 2B:
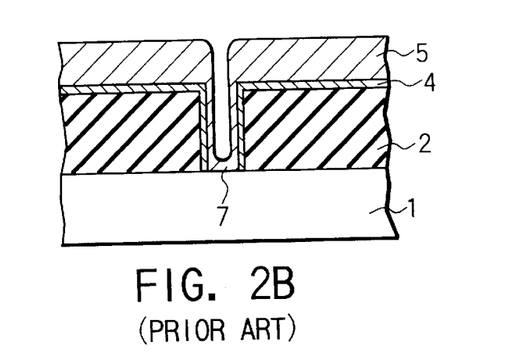
Figure 2C:
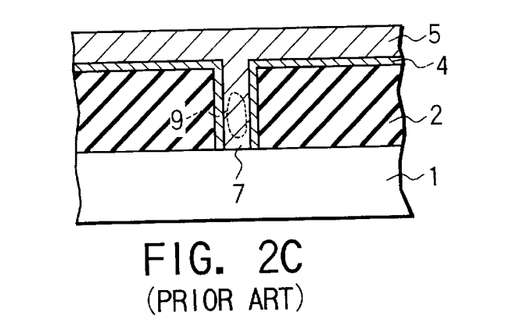
Figure 2D:
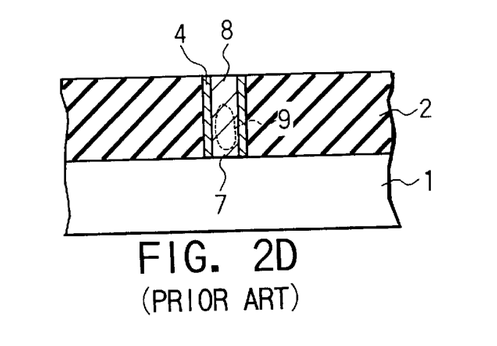

Then, a Cu film 5 with a thickness of 1 mm is formed on the insulating film 2 by means of the sputtering method, following an adhesive layer 4 with a thickness of 10 nanometers (nm) (FIG. 2B). The Cu film 5 is then heated, for example, by irradiation of a laser, and connecting hole 7 is filled up (FIG. 2C). A Cu fine contact hole 8 is then formed by eliminating the superfluous Cu film 5 remaining in other than the connecting hole 7 using the CMP method (FIG. 2D).

In the Cu fine contact hole 8 formed in the above-described manner there is a problem that a void 9 is easily created. This problem occurs because of the low degree of Cu burying. More particularly, this problem occurs because it is difficult to completely fill up connecting hole 7 with Cu in which an aspect ratio (the ratio of the depth against the diameter of the connecting hole) is high. For instance, a void is created when an aspect ratio is 1.25 or higher. For example, where the diameter is 0.8 mm or lower against a depth is 1.0 mm.

Creation of void 9 results in a partial increase in the density of current flowing in the upper and lower directions of fine contact hole 8 during the operation of the device. This causes a reduction in reliability.

As is apparent from the foregoing, the application of Cu buried wiring to the next-generation ultra high-speed device has not yet been realized because of the insufficient degree of Cu burying.

BRIEF SUMMARY OF THE INVENTION

As described above, it has conventionally been difficult to apply Cu buried wiring to the next-generation of ultra high-speed devices due to the insufficient degree of Cu burying. Thus, one object of the present invention is to provide a manufacturing method of a semiconductor device, wherein the degree of Cu burying can be heightened and buried wiring using Cu can be applied to next-generation ultra high-speed devices.

In accordance with a first aspect of the present invention, in a method of manufacturing a semiconductor device having buried-type wiring in an insulating film on a semiconductor substrate, the buried-type wiring is formed by using highly pure Cu with a low oxygen content.

In accordance with a second aspect of the present invention, a manufacturing method of a semiconductor device comprises the steps of forming a recessed part, which is used for formation of wiring in an insulating film on a semiconductor substrate; forming a highly pure Cu film with a low oxygen content on the surface of the insulating film, in which the recessed part is formed, interposing a barrier metallic film; burying the Cu film in the recessed part after applying a heat treatment to the Cu film; and eliminating the unnecessary Cu film, which remains on the surface of the insulating film except in the recessed part.

In yet another aspect of the invention, a Cu film is deposited over a dual-layer metallic barrier having particular characteristics. For example, the barrier may be comprised of Ti and TiN. Other single-layer or dual-layer structures having similar characteristics may also be used. This combination of highly pure Cu and a barrier layer allows use of lower power lasers, lower annealing temperatures, and hot Cu sputtering.

The method of manufacturing a semiconductor device provided by the present invention facilitates surface diffusibility and fluidity of Cu. This makes it possible to bury Cu even in a fine recessed part in which voids have conventionally been created.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

For a more complete understanding of the present invention and the advantages thereof, reference is now made to the following description taken in conjunction with the accompanying drawings, in which.

DETAILED DESCRIPTION OF THE INVENTION

Preferred embodiments of the present invention will now be described with reference to the accompanying drawings.

Figure 3:
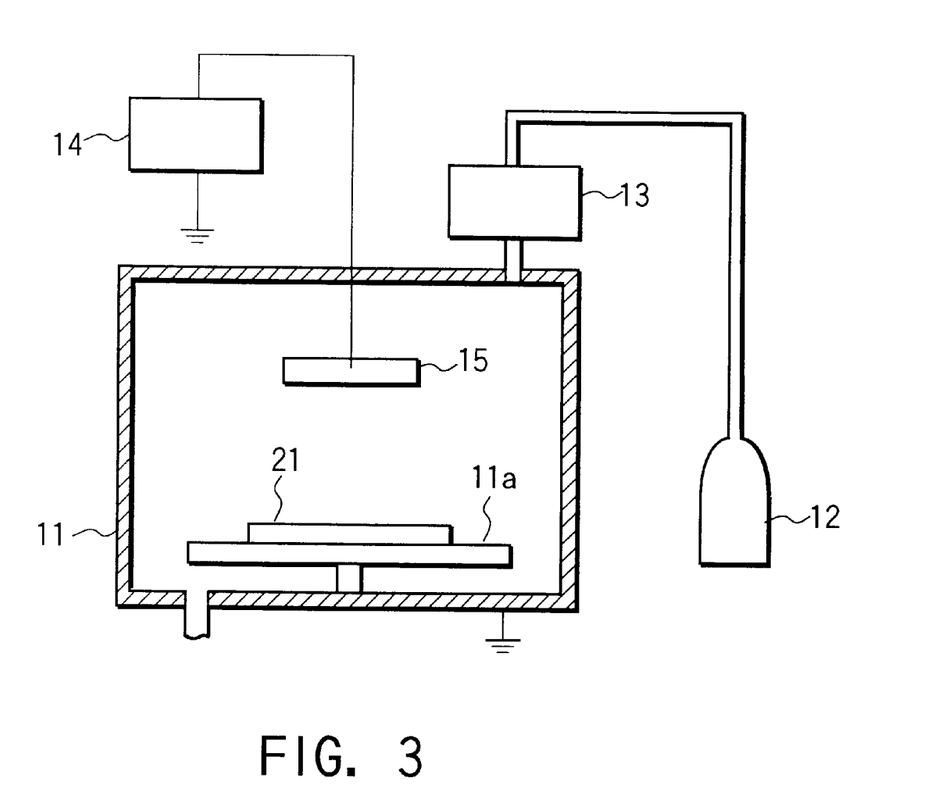
FIG. 3 shows a sputtering apparatus of an embodiment of the present invention.

FIG. 3 schematically illustrates a sputtering apparatus of an embodiment of the invention. The apparatus is used for forming a Cu film on a silicon substrate by means of a DC magnetron sputtering method. The apparatus is composed of a sputtering chamber 11, a gas supplying source 12, a gas purifier 13 and a DC power source 14.

Sputtering chamber 11 can create an ultra-high vacuum region (e.g., $2 \times 10^{-7}$ Pa) and control infiltration of oxygen and water during sputtering. Gas supplying source 12 stores sputtering gas, which is supplied into the sputtering chamber 11. For sputtering gas, Ar having a high purity level of 99.9999% is utilized.

Gas purifier 13 is provided immediately before the gas introducing port of sputtering chamber 11. Purifier 13 controls oxygen concentration and water concentration in Ar in a spot where sputtering gas from the gas supplying source 12 is used (e.g., oxygen concentration to 0.1 parts-per-billion (ppb) and water concentration to 0.7 ppb).

DC power source 14 applies a positive voltage to a silicon substrate 21 held on a holder part 11a inside the sputtering chamber 11 and a negative voltage to a Cu target 15 as a target material. For the Cu target 15, a material having a high purity level of 99.9999% and low oxygen concentration (e.g., a material having oxygen concentration of 0.1 parts-per-million (ppm) or lower and sulfur concentration of 0.05 ppm or lower) is used. In a Cu film formed by the foregoing film-forming conditions by using a sputtering apparatus, the oxygen concentration is approximately 0.5 ppm (e.g., 0.2–0.8 ppm) and sulfur concentration is approximately 0.06 ppm (e.g., 0.02–0.08 ppm).

Figure 4A:
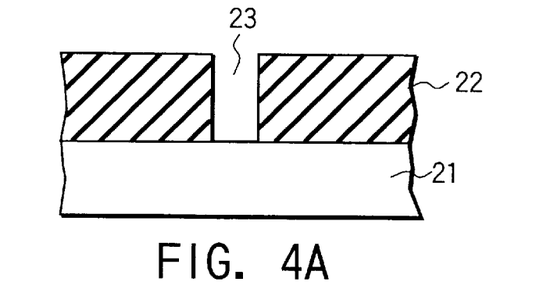
FIGS. 4A to 4D are section views illustrating an embodiment for forming a fine contact hole.

The following is a description of a method for forming buried wiring using a Cu film using the foregoing sputtering apparatus. FIGS. 4A to 4D illustrate an example method for forming a fine contact hole. A connecting hole (recessed part) 23 is formed in insulating film 22. The connecting hole has a depth reaching the surface of the silicon substrate 21 (FIG. 4A). The opening dimension of this connecting hole 23 is set to, for instance, 0.35 mm in diameter and 1.0 mm in depth.

Figure 4B:
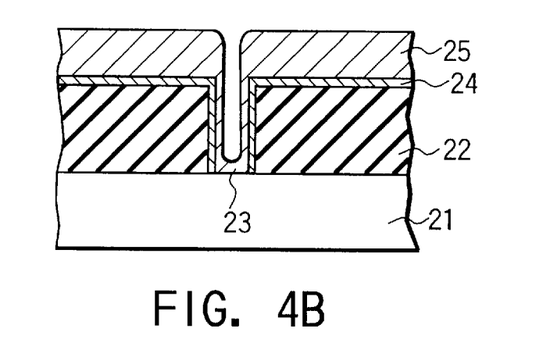

Then, after a CVD-TiN (barrier metallic film) film 24 is formed as an adhesive film (having a thickness, for example, of 10 nm), on the insulating film 22, a Cu film 25 with a thickness of 1 mm is formed by means of the DC sputtering method using the foregoing film-forming conditions (FIG. 4B). At first, a sputtering Ti film of 10 nanometers is formed as a contact metal on the insulating film. That is, by using chamber 11, which is capable of controlling a highly pure atmosphere, and using the highly pure Cu target 15, Cu film 25 is formed.

Figure 4C:
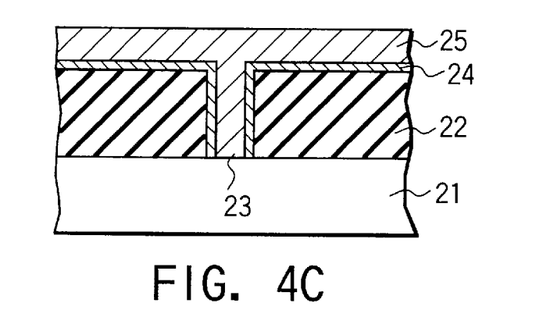
Figure 4D:
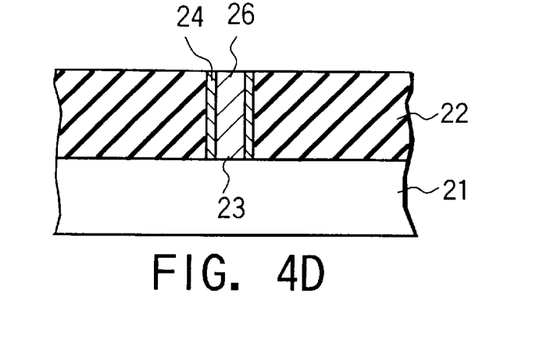

Cu film 25 has a high level of purity, and the oxygen concentration is 0.5 ppm or lower and sulfur concentration is 0.06 ppm or lower. Then, by heating Cu film 25 with laser irradiation, the connecting hole 23 is completely filled (FIG. 4C). In the case of this highly pure Cu film 25, since oxygen and sulfur content is very low, the surface diffusibility and fluidity of Cu are facilitated when a heat treatment is applied. This results in an improvement in the degree of Cu burying, making it possible to completely fill the connecting hole 23 with the Cu film 25. Thereafter, by eliminating the superfluous Cu film 25 remaining in other than the connecting hole 23 by means of the CMP method, a Cu fine contact hole 26 is formed, in which no voids are created (FIG. 4D).

As described above, controlling of oxygen concentration and sulfur concentration in the Cu film 25 enables burying of Cu even in the fine connecting hole 23, in which voids have conventionally been created and an aspect ratio is 1.25 or more. Therefore, a fine contact hole 26 using Cu is obtained without voids, making possible application of the semiconductor device in accordance with the present invention to the next-generation ultra high-speed device.

Figure 5A:
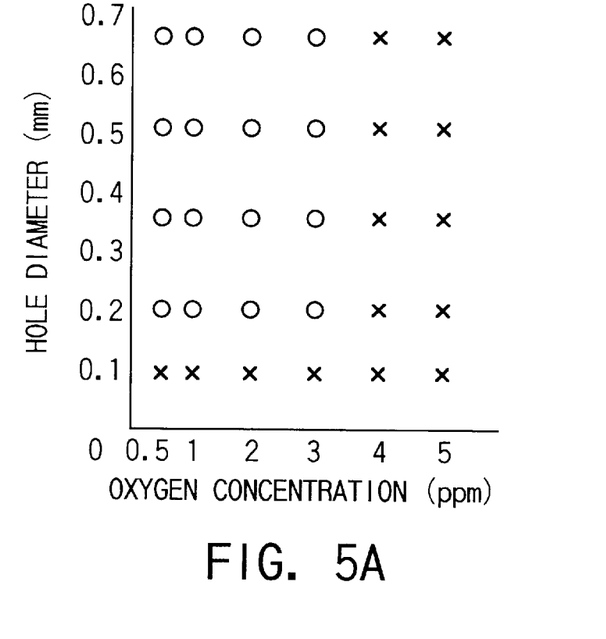
FIGS. 5A and 5B are views showing dependence of void creation on an aspect ratio.
Figure 5B:
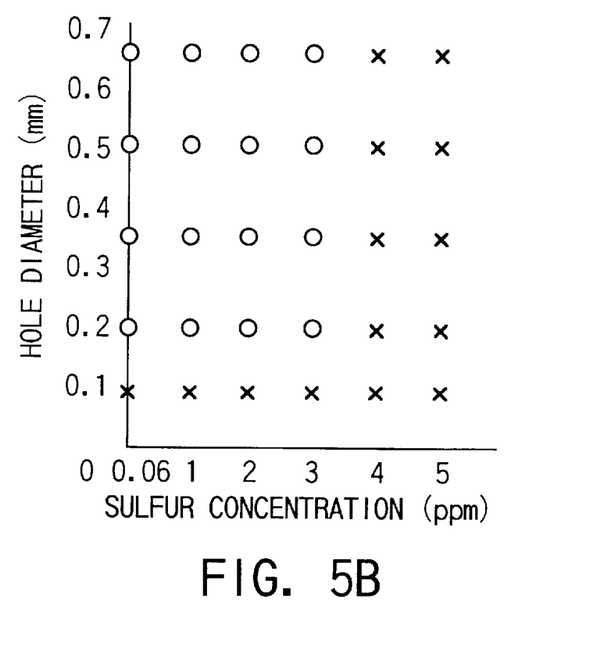

FIGS. 5A and 5B illustrate the dependence of void creation on aspect ratio. FIG. 5A shows the result of void creation in sample holes by means of a scanning electron microscope (SEM). This observation was made after the sample holes, each having a depth of 1.0 mm and respectively having diameters of 0.1 mm, 0.2 mm, 0.35 mm, 0.5 mm and 0.65 mm, were filled with Cu films by means of heat treatments with laser irradiation, in which average oxygen concentrations were respectively set to 1 ppm, 2 ppm, 3 ppm, 4 ppm and 5 ppm by injecting oxygen into highly pure Cu films each having a thickness of 1 mm by means of an ion implantation method and changing dose. The average oxygen concentration was 0.5 ppm and average sulfur concentration was 0.06 ppm.

FIG. 5B shows another observation result of void creation in sample holes by means of SEM. This observation was made after sample holes having a depth of 1.0 mm and respectively having diameters of 0.1 mm, 0.2 mm, 0.35 mm, 0.5 mm and 0.65 mm were filled with Cu films by means of heat treatments with laser irradiation, in which average sulfur concentrations were respectively set to 1 ppm, 2 ppm, 3 ppm, 4 ppm and 5 ppm by injecting sulfur into highly pure Cu films each having a thickness of 1 mm by means of an ion implantation method and changing dose.

It is apparent from these drawings that with a hole diameter of 0.2 mm or more, that is, with an aspect ratio of 5.0 or lower, when oxygen and sulfur concentrations in the Cu films are 3 ppm and lower, no void creation is recognized, and thus the holes can be filled with Cu (see marks in the drawings). On the other hand, it can be understood that when oxygen and sulfur concentrations exceed 4 ppm, voids are created irrespective of an aspect ratio (see marks in the drawings).

Also, when a hole diameter is 0.1 mm, that is, an aspect ratio is 10.0, voids are created irrespective of oxygen and sulfur concentrations. This can be attributed to dominance of certain factors which have nothing whatsoever to do with oxygen and sulfur concentrations in the Cu films, including the limit of film formation in the fine holes by means of the sputtering method, etc. Therefore, by controlling oxygen and sulfur concentrations in the Cu films to be 3 ppm or lower, Cu can be buried even in the connecting holes having aspect ratios of 5.0 or lower without creating any voids.

As described above, surface diffusibility and fluidity of Cu can be facilitated. More particularly, control is performed for oxygen and sulfur concentrations in the Cu films, in which films are formed by means of the sputtering method. Since this improves the surface diffusibility and fluidity of the Cu film by means of a heat treatment, Cu can be buried even in the fine connecting hole, in which voids have conventionally been created and the aspect ratio is high. As a result, the degree of Cu burying is greatly heightened, making it possible to easily apply Cu buried wiring to next-generation ultra high-speed devices having a fine contact hole.

The technique of Cu buried wiring disclosed herein may also be applied to other high aspect ratio structures. In the explanation of the first embodiment of the invention, reference was made to the case where Cu is buried in the connecting hole after the application of a heat treatment by using the method of laser irradiation. However, the same effect can be obtained, for instance in the cases of the method for burying Cu, by heating the silicon substrate during sputtering of Cu and using a heating furnace method for burying Cu by simultaneously applying a heat treatment to the silicon substrate and Cu after sputtering.

Figure 6A:
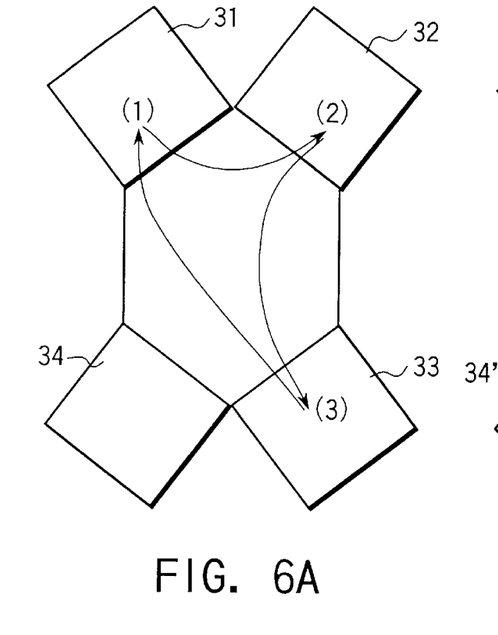
FIGS. 6A and 6B show vacuum chambers and associated processes which may be used to implement a preferred embodiment of the invention.
Figure 6B:
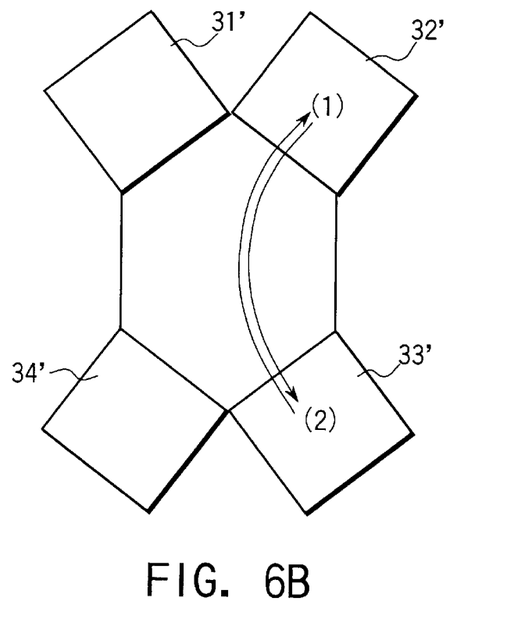

FIGS. 6A and 6B respectively show multi-chambered sputtering CVD machines for carrying out processes in accordance with one embodiment of the present invention. FIG. 6A shows a multi-chambered sputtering machine for forming a semiconductor device using highly pure Cu. In chamber 31, a 10 nm layer of Ti is deposited by sputtering (1). Then, in chamber 32, a 10 nm TiN layer is deposited using chemical vapor deposition (2) in chamber 32.

Chambers 33 and 34 are referred to as "load-lock" chambers and are used for loading and unloading wafers for processing in chambers 31 and 32. A group of wafers are first loaded into the chamber 31, and the chamber 31 is locked and a vacuum is formed within the sputtering machine. While the wafers of chamber 31 are being processed, already processed wafers in chamber 32 can be exchanged for a new set of wafers to be processed.

FIG. 6B shows the final process of Cu sputtering in a separate multi-chambered sputtering machine. Cu is sputtered (1) in chamber 32'. The wafer is then transferred to chamber 33'. If Cu sputtering (1) in chamber 32' is hot Cu sputtering, no further treatment of the highly pure Cu film is necessary because during sputtering the highly pure Cu film is effectively annealed. It may be desirable, however, to perform further annealing or laser treatment of the highly pure Cu film even if hot Cu sputtering is used.

If Cu sputtering (1) in chamber 32' is not hot Cu sputtering, the Cu must be further treated by annealing or laser. An Excimer laser of the Xe—Cl type having a wavelength of 305 nm and power in the range of 1.5–2.5 j/cm$^2$ may be used.

The Ti/TiN layer provides several advantages. The Ti layer has low resistivity, whereas the TiN layer has a low oxidation rate. The low oxidation rate of the second layer allows the wafers to be transported between sputtering machines. That is, the low oxidation rate of the second layer allows transporting of the wafers between depositing the barrier layer in the first sputtering machine, and depositing the highly pure Cu film using the second sputtering machine.

Figure 7:
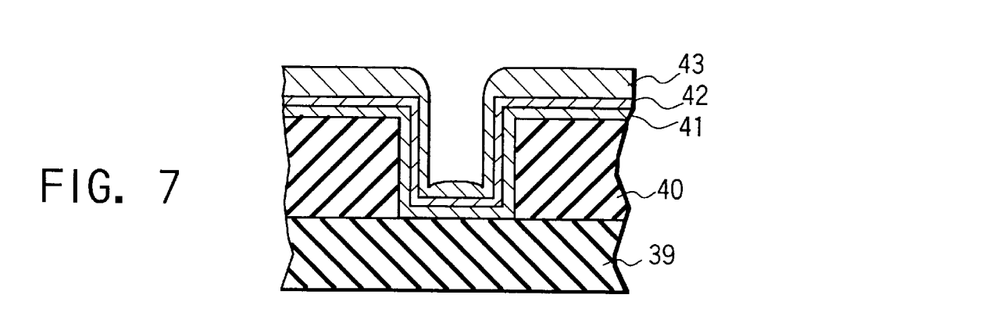
FIG. 7 is a diagram showing a semiconductor structure having layers of Ti, TiN, and highly pure Cu in accordance with a preferred embodiment of the invention.

FIG. 7 shows the structure formed by the process described above with respect to FIGS. 6A and 6B. The semiconductor device is comprised of an SiO$_2$ layer 39, an insulating film 40, a Ti layer 41, a TiN layer 42 and a highly pure Cu film 43. Ti layer 41 may have a height of, for example, 5–20 nm. The TiN layer 42 may have a height of, for example, 5–15 nm.

The structure of FIG. 7 is at the same stage of processing as is shown in FIG. 4B. This structure would need further treatment, for example by application of laser or by annealing, in order for the highly pure Cu film 43 to fill in the recess. If hot Cu sputtering is used to deposit the highly pure Cu film, however, the recess would be filled in after sputtering.

Figure 8:
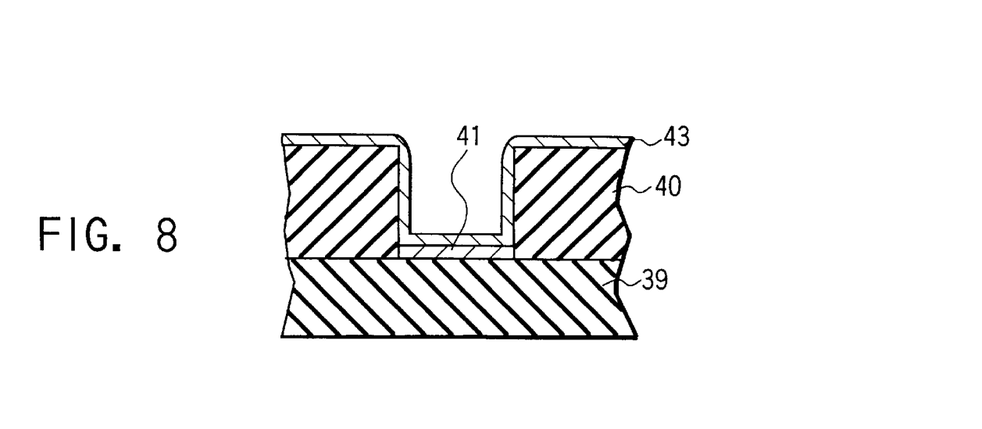
FIG. 8 is a diagram showing a semiconductor structure in which a bottom Ti layer serves as a barrier for highly pure Cu.

FIG. 8 shows an alternative structure to the semiconductor device of FIG. 7. In particular, FIG. 8 shows a semiconductor device not having Ti sidewalls. In this case, a Ti layer 41 is deposited adjacent the SiO$_2$ layer 39 and serves as a barrier for highly pure Cu film 43. The structure is also comprised of insulating film 40.

The first and second layers should have certain general characteristics. The first layer should be of low resistivity. The second layer should have the characteristics of blocking Cu penetration, and have a low oxidation rate.

For example, each of the first and second layers may be comprised of TiN. The concentration of N in the first layer must be equal to or greater than 0, and less than the concentration of N in the second layer.

As a second example, each of the first and second layers may be comprised of TiSiN. The concentration of Si in the first layer must be equal to or greater than 0, and less than the concentration of Si in the second layer. The concentration of N in the first layer must be equal to or greater than 0, and less than the concentration of N in the second layer.

As yet another example, when using Ti as the first layer, TiSiN may be used instead of using TiN as the second layer. If Ti or W is used as the first layer, a second layer of WSiN may be used.

Barrier layers in accordance with the principles and constraints taught herein may be constructed out of the following materials: oxide, nitride, silicon oxynitride, silicon carbide, Mo, MoN, Ta, TaN, W, WN, V, VN, Nb, NbN, Ti, TiN.

The high purity Cu film may be used with single or dual layer barrier structures. In general, any single or dual layer structures providing similar high resistivity characteristics may be used.

By using highly pure Cu, the present invention allows using a lower annealing temperature than is typically required by the prior art. For example, a typical prior art system requires annealing temperatures in the range of 450° C. to 600° C. The present invention allows use of temperatures in the range of 380° C. to 550° C.

Moreover, although prior art systems using an Excimer laser with impure Cu, vaporization of the Cu often occurs. The present invention allows use of lower power lasers without vaporization of the Cu.

The present invention also provides semiconductor structures in which the relationship between aspect ratios and the $O_2$ concentration in the highly pure Cu is defined by the following formula:

$$Z_0 \times AR \leq 13$$

where $Z_0$ is the concentration of $O_2$ in ppm, and AR is the aspect ratio.

The invention is not limited to Cu burying in the wiring connecting holes for the contact holes between substrate and wiring. This can also be applied to Cu burying in connecting holes and wiring in different layers. This technique can also be applied to burying in the groove for buried wiring and burying in the recessed part of a dual machine structure composed of a groove and a connecting hole.

Furthermore, a highly pure Cu film can be formed by a sputtering apparatus other than the DC magnetron sputtering method. Various other modifications and changes are also possible within the teachings of the invention.

As is apparent from the foregoing, the present invention provides a method of manufacturing a semiconductor device, which makes it possible to heighten the degree of Cu burying and apply buried wiring, thus using Cu in the next-generation ultra high-speed device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A method of manufacturing a semiconductor device comprising the steps of:

forming a recessed portion used for formation of wiring in an insulating film on a semiconductor substrate;

forming a barrier metallic layer comprising a first layer and a second layer at least in the recessed portion;

forming a copper film having an oxygen content less than or equal to 3 ppm and a high level of purity on a surface of the barrier metallic layer at least in the recessed portion by sputtering;

performing a heat treatment on the copper film; and eliminating an unnecessary portion of the copper film remaining on a surface of the insulating film.

2. A method of manufacturing a semiconductor device as claimed in claim 1, wherein the copper film in the recessed portion has a sulfur content less than or equal to 3 ppm.

3. A method of manufacturing a semiconductor device as claimed in claim 1, wherein the heat treatment of the copper film is performed by means of laser irradiation.

4. A manufacturing method of a semiconductor device as claimed in claim 1, wherein elimination of an unnecessary portion of the copper film is performed by means of CMP.

5. A manufacturing method of a semiconductor device as claimed in claim 1, wherein the recessed portion is a wiring groove.

6. A manufacturing method of a semiconductor device as claimed in claim 1, wherein the recessed portion is a wiring connecting hole.

7. A manufacturing method of a semiconductor device as claimed in claim 1, further including:

applying a heat treatment to the copper film in the recessed portion.

8. A method of manufacturing a semiconductor device structure comprising:

forming an insulating film on a semiconductor substrate;

forming a recessed portion having a high aspect ratio structure in the insulating film;

forming a barrier metallic layer on the recessed portion; and forming a highly pure copper film on the barrier metallic layer, wherein the highly pure copper film has a copper oxygen concentration such that the aspect ratio multiplied by the copper oxygen concentration in parts-per-million is $\leq 13$.

9. The method according to claim 8, wherein the step of forming a barrier metallic layer includes forming the first layer of Ti.

10. The method according to claim 8, wherein the step of forming a barrier metallic layer includes forming the second layer of TiN.

11. The method according to claim 8, further comprising the step of heating the highly pure copper film.

12. The method according to claim 11, wherein the step heating includes the step of utilizing a laser.

13. The method according to claim 11, wherein the step of heating includes the step of annealing.

14. The method according to claim 13, wherein the step of annealing includes the step of using heating temperature in a range of 380° C. to 550° C.

15. The method according to claim 8, wherein the step of forming a highly pure copper film includes the step of sputtering hot copper.

16. A method of manufacturing a semiconductor device structure comprising:

forming an insulating film on a semiconductor substrate;

forming a recessed portion having a high aspect ratio structure in the insulating film;

forming a barrier metallic layer having a first layer and a second layer in the recessed portion; and forming a highly pure copper film on the barrier metallic layer, wherein the highly pure copper film has a copper oxygen concentration such that the aspect ratio multiplied by the copper oxygen concentration in parts-per-million is ≦13.

17. The method according to claim 16, wherein the step of forming the second layer includes the substep of using a material having low oxidation qualities.

18. The method according to claim 16, wherein the step of forming the second layer includes the substep of using a material which acts as a barrier to copper.

19. The method according to claim 16, wherein the step of forming a barrier metallic layer includes forming the first layer of Ti.

20. The method according to claim 16, wherein the step of forming a barrier metallic layer includes forming the second layer of TiN.

21. The method according to claim 16, further comprising the step of heating the highly pure copper film.

22. The method according to claim 21, wherein the step heating includes the step of utilizing a laser.

23. The method according to claim 21, wherein the step heating includes the step of annealing.

24. The method according to claim 23, wherein the step of annealing includes annealing using temperature in a range of 380° C. to 550° C.

25. The method according to claim 16, wherein the step of forming a highly pure copper film includes the step of sputtering hot copper.

26. A method for lowering temperature of a semiconductor manufacturing process, comprising:

forming an insulating film on a semiconductor substrate;

forming a recessed portion having a high aspect ratio structure in the insulating film;

forming a barrier metallic layer having a first layer and a second layer in the recessed portion; and forming a highly pure copper film on the barrier metallic layer, wherein the highly pure copper film has a copper oxygen concentration such that the aspect ratio multiplied by the copper oxygen concentration in parts-per-million is ≦13.

27. The method according to claim 26, wherein the step of forming the second layer includes the substep of using a material having low oxidation qualities.

28. The method according to claim 26, wherein the step of forming the second layer includes the substep of using a material which acts as a barrier to copper.

29. The method according to claim 26, wherein the step of forming a barrier metallic layer includes forming the first layer of Ti.

30. The method according to claim 26, wherein the step of forming a barrier metallic layer includes forming the second layer of TiN.

31. The method according to claim 26, further comprising the step of heating the highly pure copper film.

32. The method according to claim 31, wherein the step heating includes the step of utilizing a laser.

33. The method according to claim 31, wherein the step heating includes the step of annealing.

34. The method according to claim 31, wherein the step of annealing includes annealing using temperature in a range of 380° C. to 550° C.

35. The method according to claim 26, wherein the step of forming a highly pure copper film includes the step of sputtering hot copper.

36. A method for improving an aspect ratio of a semiconductor structure, comprising:

forming an insulating film on a semiconductor substrate;

forming a recessed portion having a high aspect ratio structure in the insulating film;

forming a barrier metallic layer having a first layer and a second layer on the recessed portion; and forming a highly pure copper film on the barrier metallic layer, wherein the highly pure copper film has a copper oxygen concentration such that the aspect ratio multiplied by the copper oxygen concentration in parts-per-million is ≦13.

37. The method according to claim 36, wherein the step of forming the second layer includes the substep of using a material having low oxidation qualities.

38. The method according to claim 36, wherein the step of forming the second layer includes the substep of using a material which acts as a barrier to copper.

39. The method according to claim 36, wherein the step of forming a barrier metallic layer includes forming the first layer of Ti.

40. The method according to claim 36, wherein the step of forming a barrier metallic layer includes forming the second layer of TiN.

41. The method according to claim 36, further comprising the step of heating the highly pure copper film.

42. The method according to claim 41, wherein the step heating includes the step of utilizing a laser.

43. The method according to claim 41, wherein the step heating includes the step of annealing.

44. The method according to claim 43, wherein the step of annealing includes annealing using temperature in a range of 380° C. to 550° C.

45. The method according to claim 36, wherein the step of forming a highly pure copper film includes the step of sputtering hot copper.

* * * * *